(12) United States Patent
Zou et al.

(10) Patent No.: US 9,954,268 B2
(45) Date of Patent: Apr. 24, 2018

(54) DISPLAY SCREEN WITH TRANSPARENT ANTENNA STRUCTURE AND PORTABLE DEVICE HAVING THE DISPLAY SCREEN

(71) Applicant: BOE Technology Group Co., Ltd., Beijing (CN)

(72) Inventors: Bin Zou, Beijing (CN); Jiuxia Yang, Beijing (CN); Miao Liu, Beijing (CN); Feng Bai, Beijing (CN); Hongna Ye, Beijing (CN); Liyan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/127,724

(22) PCT Filed: Jan. 29, 2016

(86) PCT No.: PCT/CN2016/072825
§ 371 (c)(1),
(2) Date: Sep. 20, 2016

(87) PCT Pub. No.: WO2017/016208
PCT Pub. Date: Feb. 2, 2017

(65) Prior Publication Data
US 2017/0179567 A1    Jun. 22, 2017

(30) Foreign Application Priority Data

Jul. 28, 2015    (CN) .......................... 2015 1 0451123

(51) Int. Cl.
*H01Q 1/22* (2006.01)
*H01L 51/52* (2006.01)
(Continued)

(52) U.S. Cl.
CPC ............ *H01Q 1/22* (2013.01); *H01L 27/322* (2013.01); *H01L 27/323* (2013.01);
(Continued)

(58) Field of Classification Search
None
See application file for complete search history.

(56) References Cited

U.S. PATENT DOCUMENTS 6,522,308 B1 * 2/2003 Mathieu ............ G06K 7/10336
340/572.5
8,941,095 B2 * 1/2015 Song ........................ H05K 1/09
174/257

(Continued)

FOREIGN PATENT DOCUMENTS

CN    1358342    7/2002
CN    1622391 A  6/2005
(Continued)

OTHER PUBLICATIONS

Apr. 27, 2016—(WO) International Search Report and Written Opinion Appn PCT/CN2016/072825 with English Tran.
(Continued)

*Primary Examiner* — Joseph Schoenholtz
(74) *Attorney, Agent, or Firm* — Banner & Witcoff, Ltd.

(57) ABSTRACT

A display screen and a portable device are disclosed. The display screen includes a display region and a non-display region surrounding the display region, the display region includes at least one transparent antenna structure, the antenna structure includes an antenna and a capacitor which are located in a same layer, and the capacitor is electrically connected to the antenna. The portable device includes the display screen. The display screen and the portable device simplify the manufacturing process and also reduce the manufacturing difficulty.

19 Claims, 7 Drawing Sheets

(51) Int. Cl.
    *H01L 27/32* (2006.01)
    *H01Q 1/38* (2006.01)
(52) U.S. Cl.
    CPC ...... *H01L 27/3225* (2013.01); *H01L 27/3272* (2013.01); *H01L 51/5237* (2013.01); *H01L 51/5284* (2013.01); *H01L 51/5293* (2013.01); *H01Q 1/2291* (2013.01); *H01Q 1/38* (2013.01)

(56) References Cited

U.S. PATENT DOCUMENTS

| | | | | |
|---|---|---|---|---|
| 9,660,344 | B2* | 5/2017 | Pan | H01Q 9/0407 |
| 2014/0062818 | A1* | 3/2014 | Tsai | H01Q 5/335 |
| | | | | 343/746 |
| 2014/0078008 | A1* | 3/2014 | Kang | H01Q 5/35 |
| | | | | 343/702 |
| 2014/0104157 | A1 | 4/2014 | Burns et al. | |
| 2014/0139379 | A1* | 5/2014 | Bolin | H01Q 9/06 |
| | | | | 343/702 |
| 2014/0158987 | A1* | 6/2014 | Song | H01Q 1/1271 |
| | | | | 257/29 |
| 2016/0093940 | A1* | 3/2016 | Pan | H01Q 1/2258 |
| | | | | 455/277.1 |
| 2016/0344089 | A1* | 11/2016 | Baik | G04G 21/04 |
| 2017/0005391 | A1* | 1/2017 | Tenno | H01Q 1/2225 |
| 2017/0162937 | A1* | 6/2017 | de Rochemont | H01Q 1/38 |

FOREIGN PATENT DOCUMENTS

| | | |
|---|---|---|
| CN | 1961454 A | 5/2007 |
| CN | 101308266 A | 11/2008 |
| CN | 102197355 A | 9/2011 |
| CN | 102737582 A | 10/2012 |
| CN | 203397335 | 1/2014 |
| CN | 203720722 | 7/2014 |
| CN | 1030905095 A | 7/2014 |
| CN | 105094231 A | 11/2015 |
| KR | 20130070247 A | 6/2013 |

OTHER PUBLICATIONS

Jan. 10, 2018—(CN) First Office Action Appn 201510451123.1 with English Tran.

* cited by examiner

DISPLAY SCREEN WITH TRANSPARENT ANTENNA STRUCTURE AND PORTABLE DEVICE HAVING THE DISPLAY SCREEN

The application is a U.S. National Phase Entry of International Application No. PCT/CN2016/072825 filed on Jan. 29, 2016, designating the United States of America and claiming priority to Chinese Patent Application No. 201510451123.1, which was filed on Jul. 28, 2015. The present application claims priority to and the benefit of the above-identified applications and the above-identified applications are incorporated by reference herein in their entirety.

Embodiments of the present invention relate to a display screen and a portable device.

BACKGROUND

Portable device are becoming more and more popular, and generally includes handheld computer, mobile phone, media player and mixed products including functionalities of plural devices of such types; the abovementioned portable device can further be formed as a wearable smart device implemented by wearing.

With the improvement of requirements from users, the portable device usually needs wireless communication capability. For example, a remote wireless communication electrical system such as cell phone electrical system can be used for communication by utilizing cell-phone bands of 850 MHz, 900 MHz, 1800 MHz and 1900 MHz, and the remote wireless communication electrical system can also process a band of 2100 MHz; for another example, a short distance wireless communication link can be used to communicate with neighboring devices, and mainly includes wireless fidelity (WiFi) bands of 2.4 GHz and 5 GHz based on IEEE 802.11b standard and a Bluetooth band of 2.4 GHz. In existing technologies, the smart wearable device or portable device is generally provided with antennas inside such as global position system (GPS) antenna, BeiDou navigation satellite system (BDS) antenna, Bluetooth antenna, near field communication (NFC) antenna, and frequency modulation (FM) antenna, and also is designed with a crevice on a housing thereof to allow the abovementioned antennas to pass there-through smoothly. However, a size of the portable device is relatively small and a space for disposing the antennas is extremely limited, thus a manufacturing process of the antenna of the portable device is both complicate and difficult, and a signal of the antenna is likely to be blocked by a middle metallic structure.

SUMMARY

At least one embodiment of the present invention provides a display screen and a portable device, so as to solve the problems that the manufacturing process of the antenna of the portable device is both complicate and difficult, and the signal of the antenna is likely to be blocked by the middle metal structure in the existing technologies.

The display screen provided by the embodiments of the present invention comprises a display region and a non-display region disposed to be surrounding the display region, wherein the display region includes at least one transparent antenna structure, the antenna structure includes an antenna and a capacitor which are located in a same layer, and the capacitor is electrically connected to the antenna.

In an example, the display screen includes a first substrate and a second substrate which are disposed opposite to each other, the antenna structure is disposed at a side of the first substrate facing the second substrate, and a display device layer is disposed between the first substrate and the antenna structure.

In an example, the display device layer is a pixel unit array layer.

In an example, the display device layer is an organic electroluminescence display layer.

In an example, the display screen includes a first substrate and a second substrate which are disposed opposite to each other, and the antenna structure is disposed at a side of the second substrate facing the first substrate.

In an example, a side of the second substrate facing the first substrate is further provided with a display functional layer, and the antenna structure is disposed between the display functional layer and the second substrate.

In an example, a side of the second substrate facing the first substrate is provided with a display functional layer, and the display functional layer is disposed between the antenna structure and the second substrate.

In an example, the display functional layer is selected from a group consisting of a color resistance layer, a black matrix and a spacer layer.

In an example, the display screen includes a first substrate and a second substrate which are disposed opposite to each other, and the antenna structure is disposed at a side of the second substrate facing away from the first substrate.

In an example, a side of the second substrate facing the first substrate is further provided with a polarizer, and the antenna structure is disposed between the polarizer and the second substrate.

In an example, a side of the second substrate facing the first substrate is further provided with a polarizer, and the polarizer is disposed between the antenna structure and the second substrate.

In an example, a side of the second substrate facing away from the first substrate is further provided with a touch panel, and the antenna structure is disposed between the touch panel and the second substrate.

In an example, a side of the second substrate facing away from the first substrate is further provided with a touch panel and a protection film in sequence, and the antenna structure is disposed between the touch panel and the protection film.

In an example, the display screen further includes a shielding structure made of a transparent insulating material, the shielding structure is disposed above or under the antenna and the capacitor, and vertical projections of the antenna and the capacitor in the display region are fallen within a scope of a vertical projection of the shielding structure in the display region.

In an example, the first substrate is an array substrate, and the second substrate is a color filter substrate.

In an example, the first substrate is an array substrate, and the second substrate is an encapsulation cover plate.

In an example, materials of the antenna and the capacitor are selected from a group consisting of indium tin oxide, indium zinc oxide, indium gallium zinc oxide, nanometer silver line material, carbon tube material and graphene material.

In an example, the antenna is selected from a group consisting of near field communication (NFC) antenna, Bluetooth antenna, global position system (GPS) antenna, BeiDou navigation satellite system (BDS) antenna, radio frequency (RF) antenna and frequency modulation (FM) antenna.

The portable device provided by the embodiments of the present invention includes the display screen provided by any of the preceding examples.

BRIEF DESCRIPTION OF THE DRAWINGS

Hereafter, the embodiments of the present invention will be descried in detail with reference to the accompanying drawings, so as to make those skilled in the art understand the present invention more clearly, wherein.

DETAILED DESCRIPTION

Hereafter, the technical solutions in the embodiments of the present disclosure will be the technical solutions of the embodiments of the present disclosure will be described in a clear and complete way in connection with the drawings related to the embodiments of the present disclosure. It is obvious that the described embodiments are just a part but not all of the present disclosure. Based on the described embodiments of the present disclosure, those ordinarily skilled in the art can obtain other embodiment(s), without any inventive work, which come(s) within the scope sought for protection by the present disclosure.

Unless otherwise defined, the technical terminology or scientific terminology used herein should have the same meaning as commonly understood by one of ordinary skill in the art to which this invention belongs. Terms used in the present description and claims such as "first", "second", "third" and so on are only used for distinguishing different components, and cannot be construed as indicating or implying sequence, amount and relative importance. Likewise, a term "a," "an," or "the" does not indicate limitation in number, but specifies the presence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
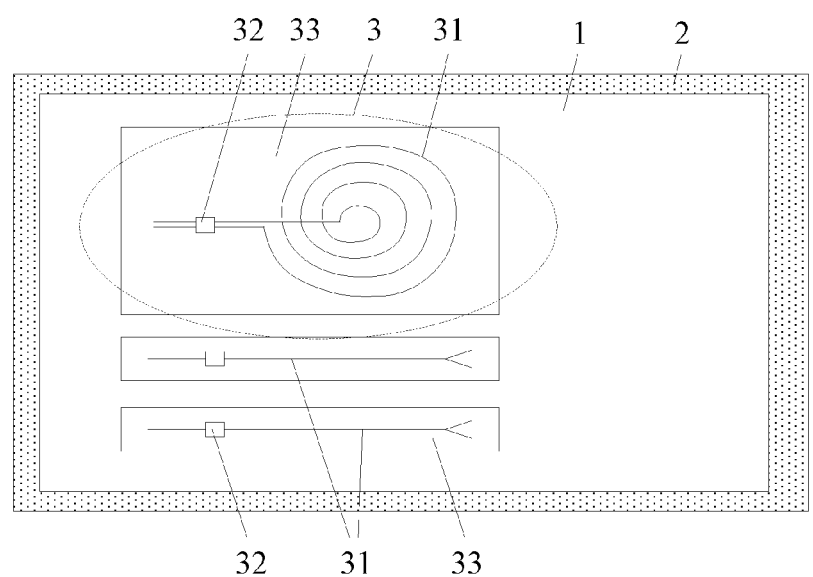
FIG. 1 is a plan view illustrating a structure of a display screen provided by an embodiment of the present invention.

As illustrated in FIG. 1, an embodiment of the present invention provides a display screen, comprising a display region 1 and a non-display region 2 surrounding the display region 1, wherein the display region 1 is provided with at least one transparent antenna structure 3, the antenna structure 3 includes an antenna 31 and a capacitor 32 which are located in a same layer, and the capacitor 32 is electrically connected to the antenna 31, wherein the capacitor 32 is configured to match an impedance of the antenna 31.

In an example, the antenna 31 and the capacitor 32 each can be a thin film made of any one selected from a group consisting of indium tin oxide, indium zinc oxide, indium gallium zinc oxide, nanometer silver line material, carbon tube material and graphene material; or can be a stacked layer of the thin films made of the abovementioned materials, for example, the antenna 31 and the capacitor 32 can be prepared from a stacked layer of an indium tin oxide thin film and an indium zinc oxide thin film; for another example, the antenna 31 and the capacitor 32 can be prepared from a stacked layer of a nanometer silver line material thin film and an indium tin oxide thin film; without listing all details herein.

Certainly, in order to be applied to portable devices with different functions, the antenna 31 can be one or two or more selected from a group consisting of NFC antenna, Bluetooth antenna, GPS antenna, BDS antenna, RF antenna and FM antenna.

In an example, in order to prevent the signal of the antenna 31 from being disturbed so as to be more stable, the display screen can further includes a shielding structure 33 made of a transparent insulating material, the shielding structure 33 is disposed above or under the antenna 31 and the capacitor 32, wherein vertical projections of the antenna 31 and the capacitor 32 in the display region 1 are fallen within a scope of a vertical projection of the shielding structure 33 in the display region 1.

In the present embodiment, by means of the transparent antenna structure 31 formed in the display region 1 of the display screen, a space sufficient to dispose the antenna 31 can be provided, and the signal of the antenna 31 will not be blocked by a middle metallic layer of the portable device; as a result, the manufacturing process of the antenna of the portable device can be simplified and the manufacturing difficulty can be reduced.

It is to be noted that, the antenna structure 3 can be flexibly disposed in different layers of the display screen depending on a hierarchical structure of the display screens. Hereafter, the antenna structure 3 of the display screen in different embodiments will be described in details in conjunction with FIGS. 2 to 10 so that those skilled in the art can understand the present invention more clearly.

Figure 2:
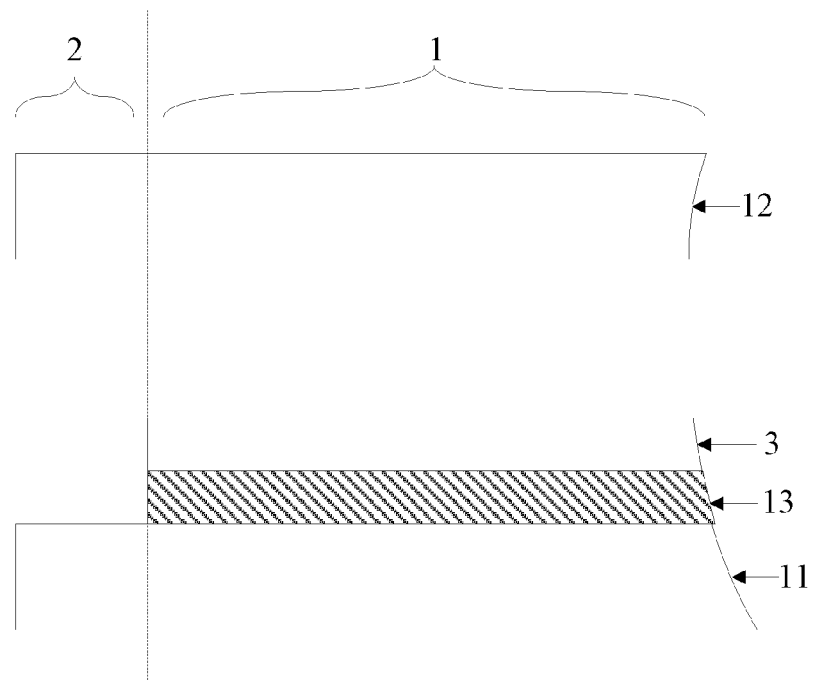
FIG. 2 is a partial cross-sectional view illustrating a first exemplary display screen provided by an embodiment of the present invention.

Referring to FIG. 2 illustrating a partial cross-sectional structure of a first exemplary display screen according to the present invention. As illustrated in FIG. 2, the display screen is divided into a display region 1 and a non-display region 2 surrounding the display region 1; the display screen includes a first substrate 11 and a second substrate 12 which are disposed opposite to each other, and at least one transparent antenna structure 3 located in the display region 1; the antenna structure 3 is disposed at a side of the first substrate 11 facing the second substrate 12, and a display device layer 13 is disposed between the first substrate 11 and the antenna structure 3. In the present embodiment, the antenna structure 3 is disposed on the first substrate 11 so as to save space.

Depending on a type of the display screen, the display device layer 13 can be applied to a liquid crystal display (LCD) screen or an organic electroluminescence display (OELD) screen. In an example, the display device layer 13 can be a pixel unit array layer, and correspondingly the second substrate 12 is a color filter (CF) substrate; for example, the display device layer 13 is a pixel unit array layer used for LCD screen and is formed on the first substrate 11, thus the antenna structure 3 is suitable to be disposed in a LCD screen. In another example, the display device layer 13 can be an OELD layer, and correspondingly the second substrate 12 can be an encapsulation cover plate; for example, the display device layer 13 is an OELD layer used for an OELD screen and is formed on the first substrate 11, thus the antenna structure 3 is suitable to be disposed in an OELD screen.

Figure 3:
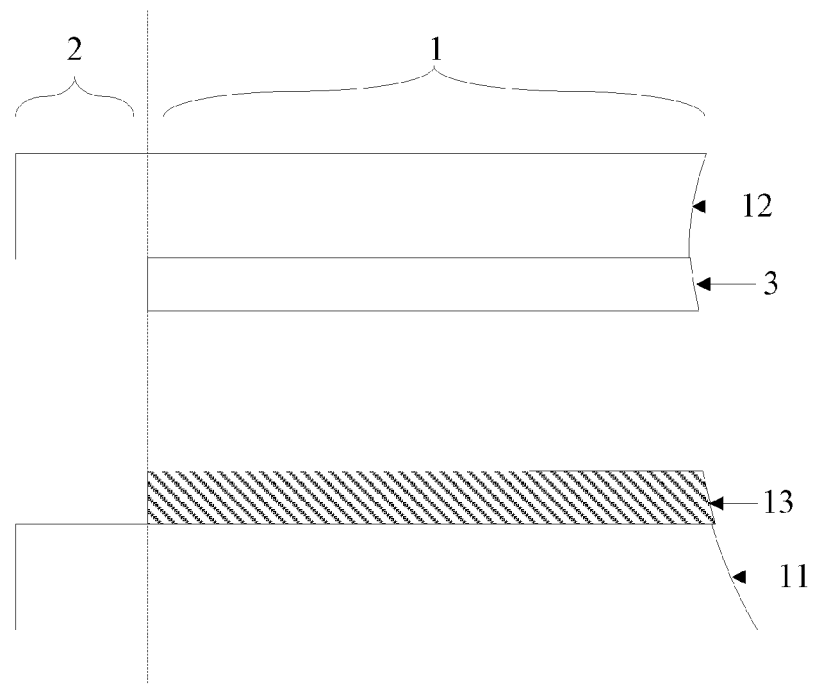
FIG. 3 is a partial cross-sectional view illustrating a second exemplary display screen provided by an embodiment of the present invention.

Referring to FIG. 3 illustrating a partial cross-section structure of a second exemplary display screen according to the present invention. As illustrated in FIG. 3, the display screen is divided into a display region 1 and a non-display region 2 surrounding the display region 1; the display screen includes a first substrate 11 and a second substrate 12 which are disposed opposite to each other, and at least one transparent antenna structure 3 located in the display region 1; the antenna structure 3 is disposed at a side of the second substrate 12 facing the first substrate 11. In the present embodiment, the antenna structure 3 is disposed on the second substrate 12 so as to save space. Besides, the second substrate 12 can be a CF substrate so as to be applied to a LCD screen; the second substrate 12 can also be an encapsulation cover plate so as to be applied to an OELD screen.

Figure 4:
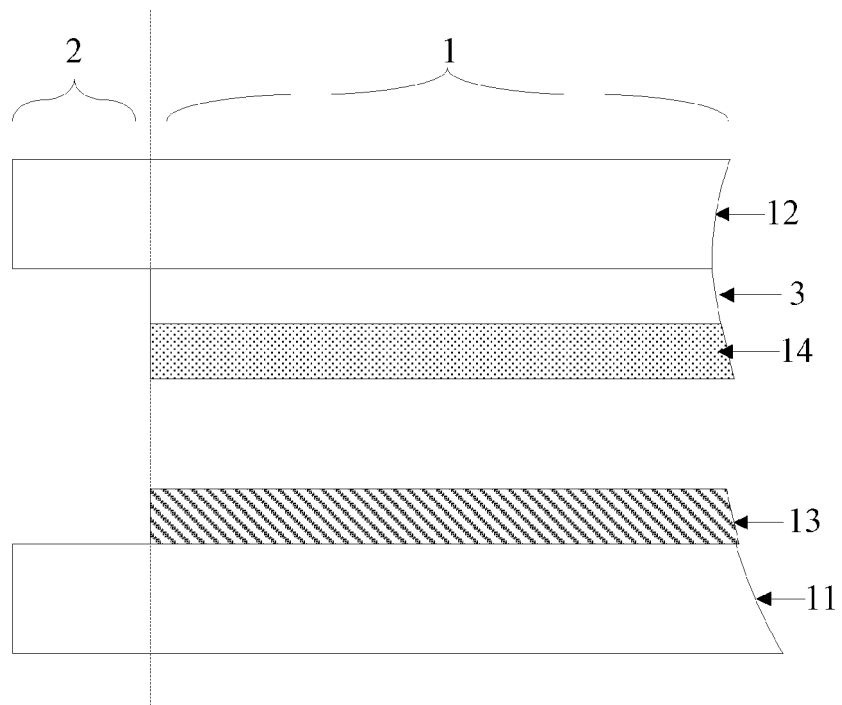
FIG. 4 is a partial cross-sectional view illustrating a third exemplary display screen provided by an embodiment of the present invention.

Referring to FIG. 4 illustrating a partial cross-sectional structure of a third exemplary display screen according to the present invention. As illustrated in FIG. 4, the display screen is divided into a display region 1 and a non-display region 2 surrounding the display region 1; the display screen includes a first substrate 11 and a second substrate 12 which are disposed opposite to each other, and at least one transparent antenna structure 3 located in the display region 1; the antenna structure 3 is disposed at a side of the second substrate 12 facing the first substrate 11. The side of the second substrate 12 facing the first substrate 11 is further provided with a display functional layer 14, and the antenna structure 3 is disposed between the display functional layer 14 and the second substrate 12.

Figure 5:
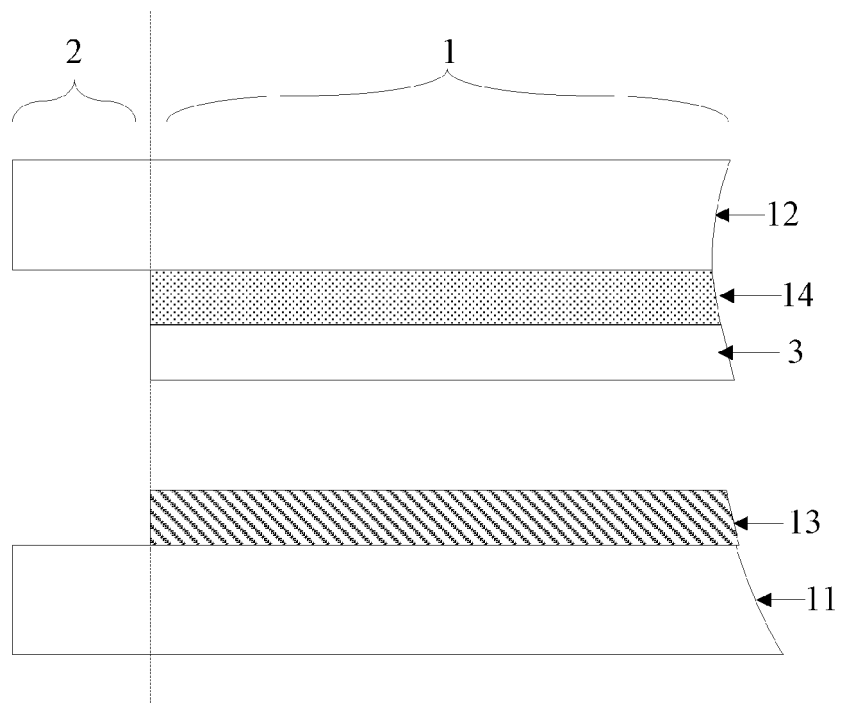
FIG. 5 is a partial cross-sectional view illustrating a fourth exemplary display screen provided by an embodiment of the present invention.

Referring to FIG. 5 illustrating a partial cross-sectional structure of a fourth exemplary display screen according to the present invention. Unlike the embodiment illustrated in FIG. 4, the display functional layer 14 in the present embodiment is disposed between the antenna structure 3 and the second substrate 12.

In the embodiments illustrated in FIGS. 4 and 5, the display functional layer 14 can include a color resistance layer, a black matrix, a spacer layer or different kinds of layer structures required by a LCD screen. In an example, the display functional layer 14 is a structure including one layer or multiple layers selected from a group consisting of a color resistance layer, a black matrix and a spacer layer, such that the antenna structure 3 is suitable to be disposed in a LCD screen.

Figure 6:
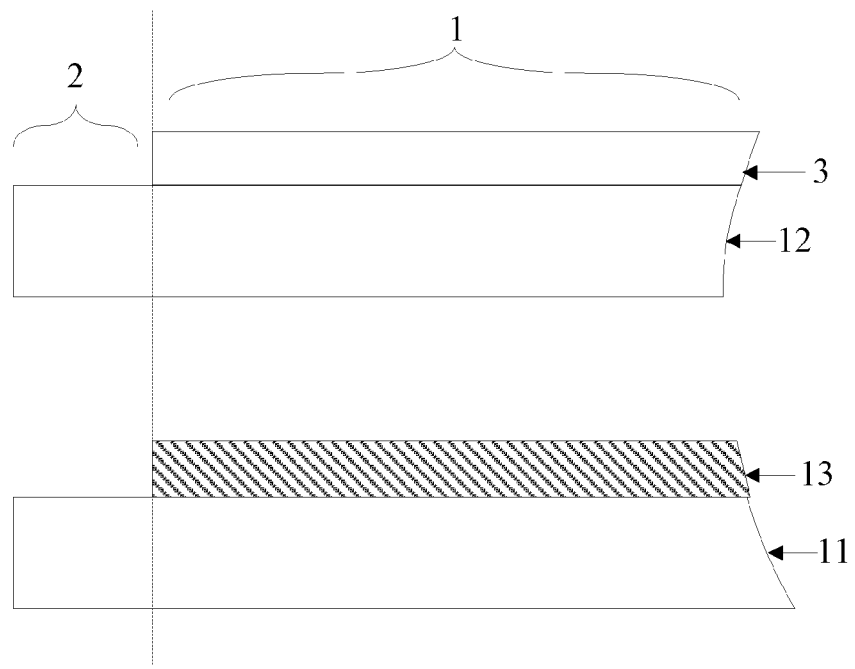
FIG. 6 is a partial cross-sectional view illustrating a fifth exemplary display screen provided by an embodiment of the present invention.

Referring to FIG. 6 illustrating a partial cross-sectional structure of a fifth exemplary display screen according to the present invention. As illustrated in FIG. 6, the display screen is divided into a display region 1 and a non-display region 2 surrounding the display region 1; the display screen includes a first substrate 11 and a second substrate 12 which are disposed opposite to each other, and at least one transparent antenna structure 3 located in the display region 1. Unlike the embodiment illustrated in FIG. 3, the antenna structure 3 is disposed at a side of the second substrate 12 facing away from the first substrate 11. In the present embodiment, the antenna structure 3 is disposed on the second substrate 12 so as to save space; besides, the second substrate 12 can be a CF substrate so as to be applied to a LCD screen; the second substrate 12 can also be an encapsulation cover plate so as to be applied to an OELD screen.

Figure 7:
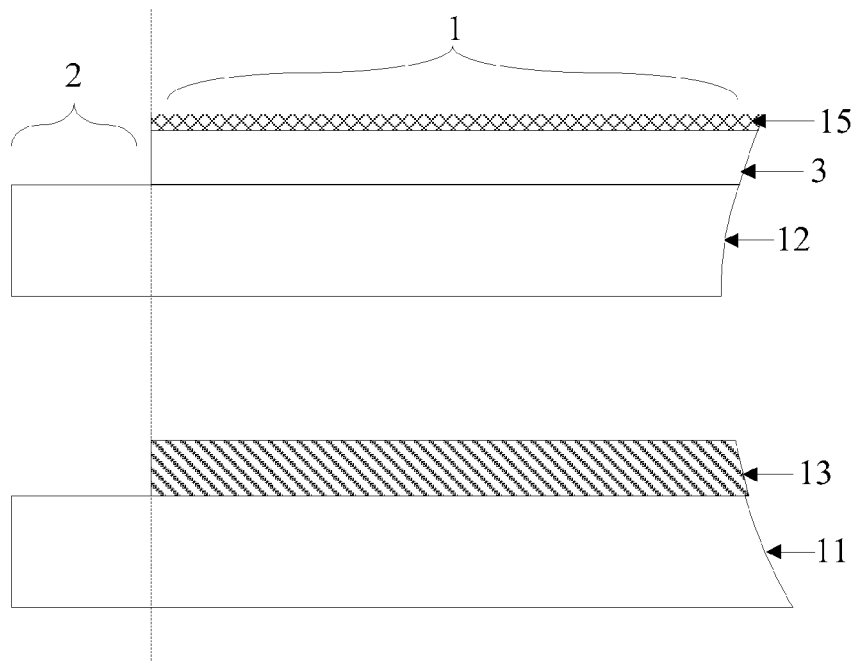
FIG. 7 is a partial cross-sectional view illustrating a sixth exemplary display screen provided by an embodiment of the present invention.

Referring to FIG. 7 illustrating a partial cross-sectional structure of a sixth exemplary display screen according to the present invention. As illustrated in FIG. 7, the display screen is divided into a display region 1 and a non-display region 2 surrounding the display region 1; the display screen includes a first substrate 11 and a second substrate 12 which are disposed opposite to each other, and at least one transparent antenna structure 3 located in the display region 1; the antenna structure 3 is disposed at a side of the second substrate 12 facing away from the first substrate 11, wherein a side of the second substrate 12 facing the first substrate 11 is further provided with a polarizer 15, and the antenna structure 3 is disposed between the polarizer 15 and the second substrate 12.

Figure 8:
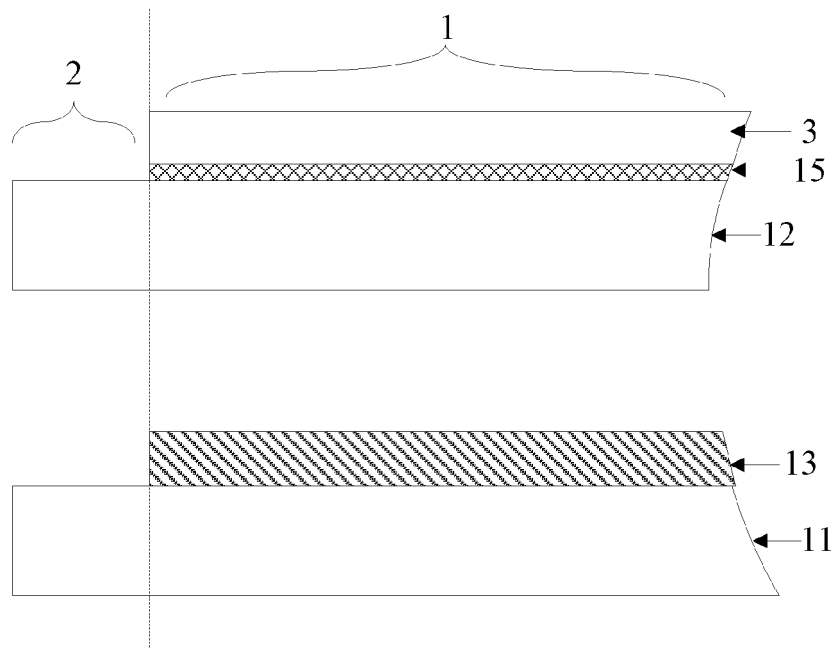
FIG. 8 is a partial cross-sectional view illustrating a seventh exemplary display screen provided by an embodiment of the present invention.

Referring to FIG. 8 illustrating a partial cross-sectional structure of a seventh exemplary display screen according to the present invention. Unlike the embodiment illustrated in FIG. 7, the polarizer 15 is disposed between the antenna structure 3 and the second substrate 12.

In the embodiments illustrated in FIGS. 7 and 8, the polarizer 15 can perform polarization detection of the light, so that the antenna structure 3 is suitable to be disposed in a LCD screen.

Figure 9:
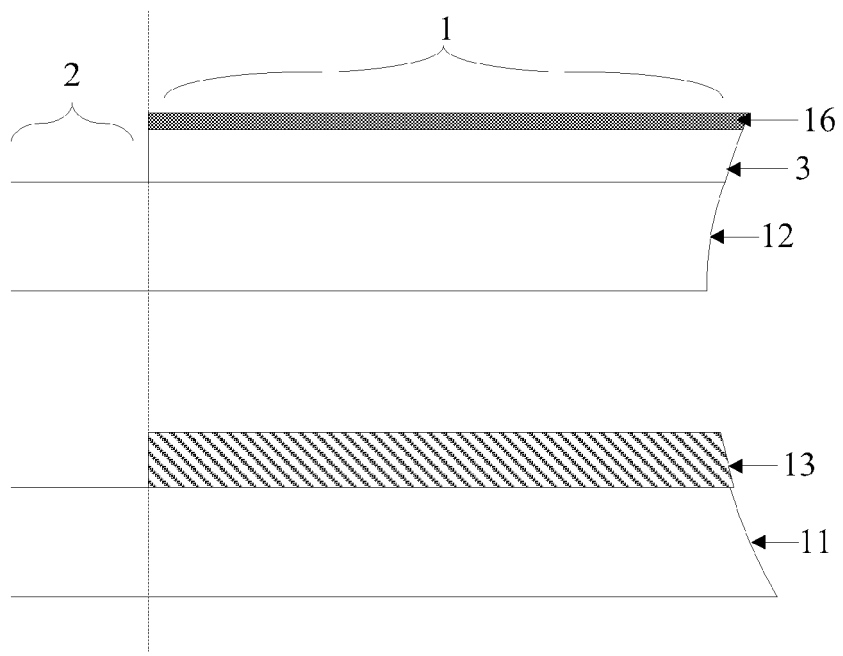
FIG. 9 is a partial cross-sectional view illustrating an eighth exemplary display screen provided by an embodiment of the present invention.

Referring to FIG. 9 illustrating a partial cross-sectional structure of an eighth exemplary display screen according to the present invention. As illustrated in FIG. 9, the display screen is divided into a display region 1 and a non-display region 2 surrounding the display region 1; the display screen includes a first substrate 11 and a second substrate 12 which are disposed opposite to each other, and at least one transparent antenna structure 3 located in the display region 1; the antenna structure 3 is disposed at a side of the second substrate 12 facing away from the first substrate 11, wherein the side of the second substrate 12 facing away from the first substrate 11 is further provided with a touch panel 16, and the antenna structure 3 is disposed between the touch panel 16 and the second substrate 12. In fact, the touch panel in this kind of structure can be combined with any display screen of FIGS. 2 to 8 without repeating herein.

Figure 10:
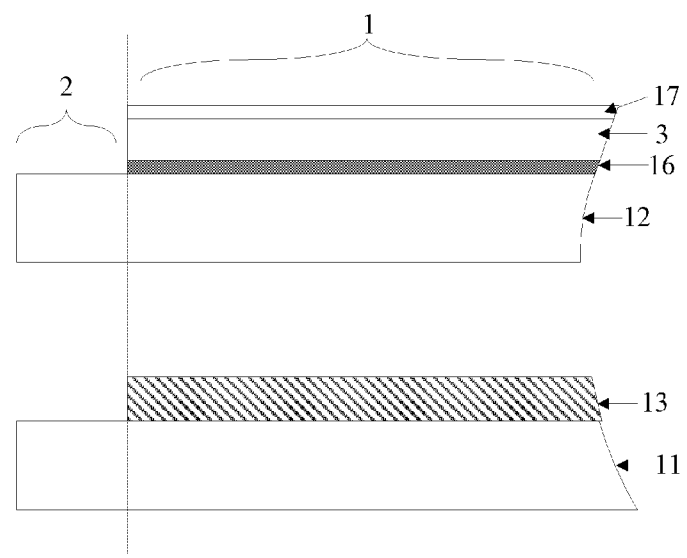
FIG. 10 is a partial cross-sectional view illustrating a ninth exemplary display screen provided by an embodiment of the present invention.

Referring to FIG. 10 illustrating a partial cross-sectional structure of a ninth exemplary display screen according to the present invention. As illustrated in FIG. 10, the display screen is divided into a display region 1 and a non-display region 2 surrounding the display region 1; the display screen includes a first substrate 11 and a second substrate 12 which are disposed opposite to each other, and at least one transparent antenna structure 3 located in the display region 1; a side of the second substrate 12 facing away from the first substrate 11 is further provided with a touch panel 16 and a protection film 17, and the antenna structure 3 is disposed between the touch panel 16 and the protection film 17.

Obviously, in the display screens of the embodiments illustrated in the abovementioned FIGS. 3 to 10, the side of the first substrate 11 facing the second substrate 12 can always be provided with a display device layer 13; depending on the type of the display screen, the display device layer

13 can be a pixel unit array layer or an OELD layer, and certainly can also be an electrophoresis particle layer; without listing all details herein.

In some cases, the display screens of the embodiments illustrated in FIGS. 7 and 8 are suitable for a LCD screen, while the display screens of the embodiments illustrated in FIGS. 9 and 10 can be combined with the display screens of the embodiments illustrated in FIGS. 2 to 8 so as to realize a touch function.

Besides, in some embodiments where the display screen is a LCD screen, a liquid crystal (LC) layer (not illustrated) can be disposed between the first substrate 11 and the second substrate 12; and the antenna 31 and the capacitor 32 in each of the display screens illustrated in FIGS. 2 to 10 can realize a connection between the display screen and an external circuit through a flexible circuit board, a port device or other connection methods, without illustrating herein.

It is to be noted that, the antenna 31 can have a spiral line shape illustrated in FIG. 1, or can simply have a line shape, or can have other shapes which can realize receiving or sending signals without repeating herein.

In the display screens provided by the embodiments of the present invention, by means of the transparent antenna structure formed in the display region of the display screen, a space sufficient to dispose the antenna can be provided, and the signal of the antenna will not be blocked by a middle metallic layer of the portable device; as a result, the manufacturing process of the antenna of the portable device can be simplified and the manufacturing difficulty can be reduced.

Figure 11:
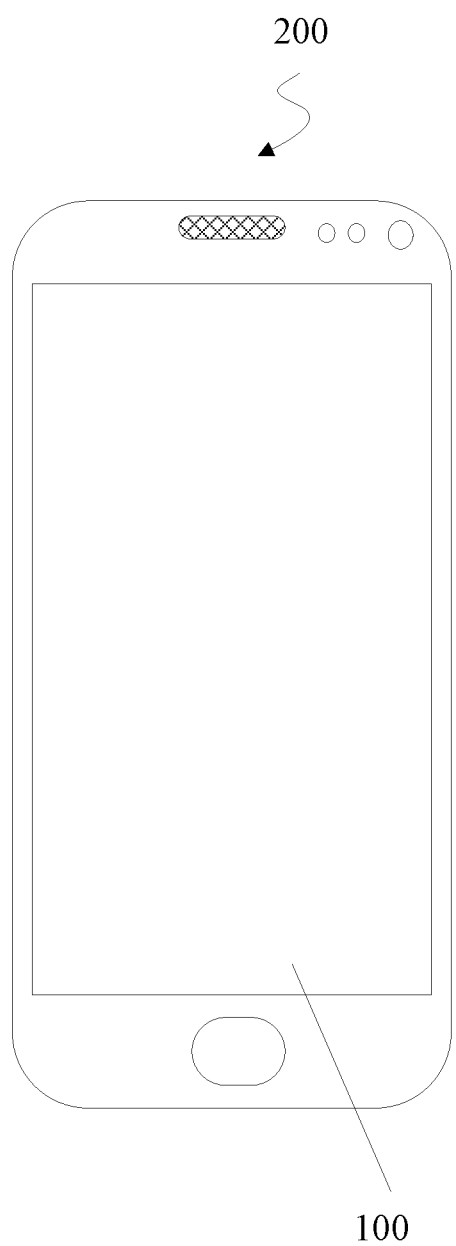
FIG. 11 is a schematic diagram of a portable device provided by an embodiment of the present invention.

Referring to FIG. 11, an embodiment of the present invention further provides a portable device 200 including the display screen 100 according to any of the preceding embodiments.

In the portable device provided by the embodiment of the present invention, by means of the transparent antenna structure formed in the display region of the display screen, a space sufficient to dispose the antenna can be provided, and the signal of the antenna will not be blocked by a middle metallic layer of the portable device; as a result, the manufacturing process of the antenna of the portable device can be simplified and the manufacturing difficulty can be reduced.

The foregoing are merely specific embodiments of the invention, but not limitative to the protection scope of the present disclosure. Therefore, the protection scope of the invention should be defined by the accompanying claims.

The present disclosure claims the benefits of Chinese patent application No. 201510451123.1, which was filed on Jul. 28, 2015 and is fully incorporated herein by reference as part of this application.

What is claimed is:

1. A display screen, comprising:
    a display region; and
    a non-display region disposed to be surrounding the display region,
    wherein the display region comprises at least one transparent antenna structure, the antenna structure comprises one antenna in a spiral line shape or a straight line shape and one capacitor which are located in a same layer, and the capacitor is electrically connected to the antenna to match an impedance of the antenna, and
    wherein the antenna and the capacitor each are a stacked layer of thin films made of any one selected from the group consisting of indium tin oxide, indium zinc oxide, indium gallium zinc oxide, nanometer silver line material, carbon tube material and graphene material.

2. The display screen according to claim 1, comprising a first substrate and a second substrate which are disposed opposite to each other, wherein the antenna structure is disposed at a side of the first substrate facing the second substrate, and a display device layer is disposed between the first substrate and the antenna structure.

3. The display screen according to claim 2, wherein the display device layer is a pixel unit array layer.

4. The display screen according to claim 2, wherein the display device layer is an organic electroluminescence display (OELD) layer.

5. The display screen according to claim 1, comprising a first substrate and a second substrate which are disposed opposite to each other, and the antenna structure is disposed at a side of the second substrate facing the first substrate.

6. The display screen according to claim 5, wherein,
    a side of the second substrate facing the first substrate is further provided with a display functional layer, and the antenna structure is disposed between the display functional layer and the second substrate;
    or,
    the side of the second substrate facing the first substrate is further provided with a display functional layer, and the display functional layer is disposed between the antenna structure and the second substrate.

7. The display screen according to claim 6, wherein the display functional layer is selected from the group consisting of a color resistance layer, a black matrix and a spacer layer.

8. The display screen according to claim 1, comprising a first substrate and a second substrate which are disposed opposite to each other, and the antenna structure is disposed at a side of the second substrate facing away from the first substrate.

9. The display screen according to claim 8, wherein,
    the side of the second substrate facing away from the first substrate is further provided with a polarizer, and the antenna structure is disposed between the polarizer and the second substrate;
    or,
    the side of the second substrate facing away from the first substrate is further provided with a polarizer, and the polarized is disposed between the antenna structure and the second substrate.

10. The display screen according to claim 8, wherein,
    a side of the second substrate facing away from the first substrate is further provided with a touch panel, and the antenna structure is disposed between the touch panel and the second substrate;
    or,
    a side of the second substrate facing away from the first substrate is further provided with a touch panel and a protection film, and the antenna structure is disposed between the touch panel and the protection film.

11. The display screen according to claim 1, further comprising a shielding structure made of a transparent insulating material, wherein the shielding structure is disposed above or under the antenna and the capacitor, and vertical projections of the antenna and the capacitor in the display region fall within a scope of a vertical projection of the shielding structure in the display region.

12. The display screen according to claim 2, wherein the first substrate is an array substrate, and the second substrate is a color filter substrate.

13. The display screen according to claim 2, wherein the first substrate is an array substrate, and the second substrate is an encapsulation cover plate.

14. The display screen according to claim 1, wherein the antenna is selected from the group consisting of a near field communication (NFC) antenna, a Bluetooth antenna, a global position system (GPS) antenna, a BeiDou navigation satellite system (BDS) antenna, a radio frequency (RF) antenna and a frequency modulation (FM) antenna.

15. A portable device, comprising the display screen according to claim 1.

16. The display screen according to claim 5, wherein the first substrate is an array substrate, and the second substrate is a color filter substrate.

17. The display screen according to claim 8, wherein the first substrate is an array substrate, and the second substrate is a color filter substrate.

18. The display screen according to claim 5, wherein the first substrate is an array substrate, and the second substrate is an encapsulation cover plate.

19. The display screen according to claim 8, wherein the first substrate is an array substrate, and the second substrate is an encapsulation cover plate.

\* \* \* \* \*